(12) United States Patent
Ball

(10) Patent No.: US 6,403,449 B1
(45) Date of Patent: Jun. 11, 2002

(54) METHOD OF RELIEVING SURFACE TENSION ON A SEMICONDUCTOR WAFER

(75) Inventor: Michael B. Ball, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/560,827

(22) Filed: Apr. 28, 2000

(51) Int. Cl.⁷ .............................................. H01L 21/46
(52) U.S. Cl. ...................... 438/460; 438/459; 438/462; 438/464
(58) Field of Search ............................... 438/460, 461, 438/462, 463, 464, 465, 459

(56) References Cited

U.S. PATENT DOCUMENTS

| | | | |
|---|---|---|---|
| 3,677,875 A | 7/1972 | Althouse | 161/117 |
| 4,722,130 A | 2/1988 | Kimura et al. | 29/413 |
| 5,071,792 A | 12/1991 | VanVonno et al. | 437/227 |
| 5,185,292 A | 2/1993 | VanVonno et al. | 437/180 |
| 5,476,566 A | 12/1995 | Cavasin | 156/249 |
| 5,480,842 A | 1/1996 | Clifton et al. | 437/226 |
| 5,824,595 A | 10/1998 | Igel et al. | 438/464 |
| 5,888,883 A | 3/1999 | Sasaki et al. | 438/460 |
| 6,107,164 A * | 8/2000 | Ohuchi | 438/465 |
| 6,184,109 B1 * | 2/2001 | Sasaki et al. | 438/464 |

OTHER PUBLICATIONS

"The Chip Packaging Manual, an Introduction to Semiconductor Assembly Operations and Companion Study Guide to "Chip Packaging" Video Training Program", by Peter Van Zant and Donald Mason, 1987.

"Toshiba Develops Paper–Thin Package", by Yoshiko Hara, EE Times, Jun. 2, 1999.

* cited by examiner

Primary Examiner—Kevin M. Picardat

(57) ABSTRACT

A method used during the manufacture of a semiconductor device comprises providing a semiconductor wafer assembly, the assembly including a plurality of unsegmented semiconductor dice. A coating layer is formed over the semiconductor wafer assembly which causes the wafer to warp, for example through a surface tension exerted on the wafer assembly by the coating layer. To reduce wafer warp a series of grooves is etched or cut into the coating layer. The grooves are believed to relieve surface tension exerted on the wafer by the coating layer. An inventive structure resulting from the method is also described.

18 Claims, 3 Drawing Sheets

US 6,403,449 B1

METHOD OF RELIEVING SURFACE TENSION ON A SEMICONDUCTOR WAFER

FIELD OF THE INVENTION

This invention relates to the field of semiconductor manufacture, and more particularly to a method for reducing surface tension and warpage on a semiconductor wafer during semiconductor device manufacture and an inventive structure resulting therefrom.

BACKGROUND OF THE INVENTION

During the manufacture of semiconductor devices such as dynamic random access memories (DRAMs), static random access memories (SRAMs), microprocessors, logic, etc., several semiconductor wafer assembly structures are commonly formed. For example, a semiconductor wafer is doped then dielectric layers, polysilicon layers, and metal features such as contact plugs and bond pads are formed over the wafer. FIG. 1 depicts a planar semiconductor wafer assembly 10 having a plurality of unsegmented semiconductor dice 12 formed thereon.

Other layers commonly formed after formation of the bond pads include coating layers 14 such as a plasma-deposited passivation layer. The passivation layer often comprises more than one layer. For example, a first tetra-ethyl orthosilicate (TEOS) layer between about 2,150 angstroms (Å) and about 2,450 Å can be formed over the wafer surface, then a sputter etch can be performed to reduce breadloafing and keyholing between metal lines. This results in a first TEOS layer between about 500 Å and about 600 Å. Subsequently, a second TEOS layer is deposited to a thickness of between about 10,850 Å and about 11,150 Å, then a silicon nitride layer at a thickness of between about 3,680 Å and about 4,320 Å. The passivation layer functions as an alpha barrier and/or a passivation layer to reduce damage to the semiconductor device from mechanical contact or chemical contaminants.

After forming the passivation layer, a protective polyimide layer can be formed to function as a die coat which protects the passivation layers from cracking, for example from contact with a lead frame in a "leads-over-chip" assembly. The polyimide material can comprise an organic material spun onto the wafer surface. A polyimide which is sensitive to ultraviolet light can be used or, in the alternative, a UV-sensitive resist is patterned over the polyimide to expose the bond pads. The polyimide (or the resist) is exposed to a patterned UV source, and the polyimide is etched from the bond pads and any other necessary locations such as fuse banks. A negative resist/polyimide can also be used. After etching the polyimide from the bond pads and other areas, a final cure of the polyimide is performed, for example by exposing the polyimide to a temperature of from about 200° C. to about 350° C. for a period of about 9 hours. This step drives out solvents from the polyimide and reduces the layer thickness from about 14 microns to about 9 microns and leaves a hardened film.

Another process used with semiconductor devices includes the removal of a portion of the backside of the semiconductor wafer to produce a thinner semiconductor device, in a process referred to as "backgrinding" or "back-lapping." This process includes protecting the front (circuit side) of the wafer with an adhesive tape or a spun-on photoresist, then backgrinding or polishing the back of the wafer until the desired wafer thickness is achieved. A typical process thins the wafer from a starting thickness of 30 mils (0.79 millimeter) to as thin as 7 or 8 mils (0.18 millimeter to 0.20 millimeter), for example to form thin small outline package (TSOP) devices.

An obvious result of thinning the wafer is that it becomes more fragile and susceptible to damage. With less resistance to flexing, additional care in processing and transporting the wafer must be taken to minimize scrap. In addition to flexing, a wafer can warp which is known to result in various manufacturing problems such as misaligned and poorly focused photolithography which can affect, for example, patterning of the polyimide to expose the bond pads and fuse banks. FIG. 2 depicts a wafer assembly 20 exhibiting a degree of warping.

Warped wafers have also been found to contribute to wafer breakage. For example, transporting the wafers can be performed using a flexible chuck which holds the wafer through the application of a vacuum. It is difficult to maintain an airtight seal between an excessively warped wafer and the flexible chuck, and thus the wafer can dislodge from the chuck and become damaged from contact with external surfaces. A method and structure which results in less warpage to the wafer and less damage and scrap would be desirable.

SUMMARY OF THE INVENTION

The present invention provides a new method and resulting structure which reduces problems associated with the manufacture of semiconductor devices, particularly problems resulting from warped wafers.

In accordance with one embodiment of the invention a semiconductor wafer assembly comprising a semiconductor wafer and a plurality of unsegmented semiconductor dice is provided. A coating such as a passivation layer or polyimide layer as previously described, or another coating layer, is formed over the front (circuit side) of a semiconductor wafer.

After forming the coating layer a series of grooves is chemically or mechanically etched in the coating layer. The wafer itself can remain unetched, or a small groove only partially through the wafer can be etched therein. The grooves have been found to reduce the severity of wafer warping and to decrease various problems associated with warped wafers as described below. After etching the grooves through the coating layer various additional wafer processing steps can be performed, such as backgrinding the wafer. Finally, the wafer is diced and device processing continues, for example die attach, wire bond, and encapsulation steps.

Objects and advantages will become apparent to those skilled in the art from the following detailed description read in conjunction with the appended claims and the drawings attached hereto.

It should be emphasized that the drawings herein may not be to exact scale and are schematic representations. The drawings are not intended to portray the specific parameters, materials, particular uses, or the structural details of the invention, which can be determined by one of skill in the art by examination of the information herein.

DETAILED DESCRIPTION OF THE PREFERRED EMBODIMENT

Figure 1:
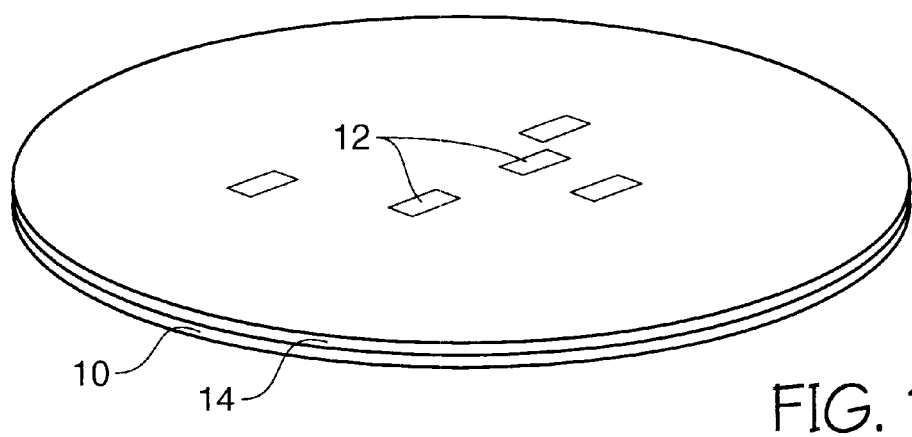
FIG. 1 is an isometric view depicting a planar semiconductor wafer assembly having a plurality of unsegmented semiconductor dice.
Figure 2:
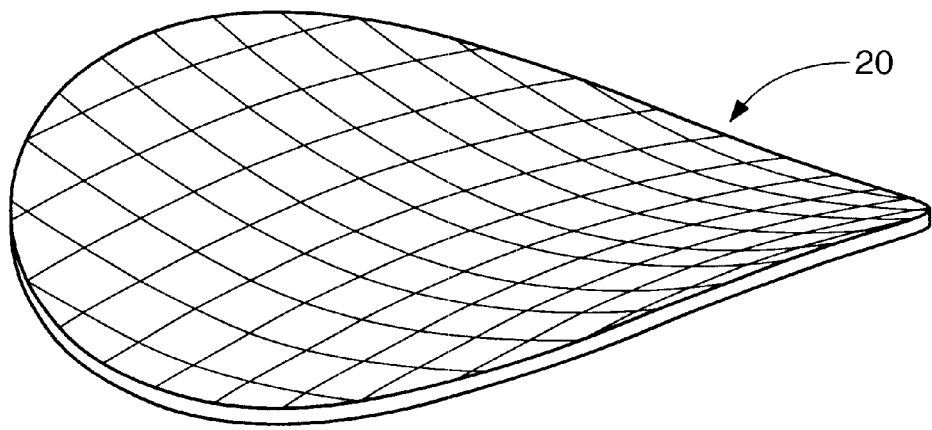
FIG. 2 is an isometric view depicting a semiconductor wafer assembly having coating layer formed thereover and exhibiting a degree of warping.
Figure 3:
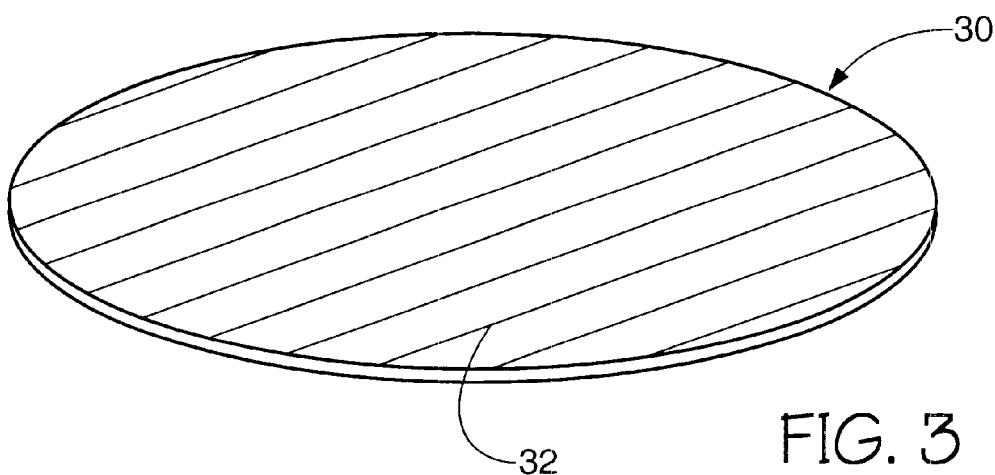
FIG. 3 is an isometric view depicting a wafer assembly having a coating layer with a series of generally parallel spaced grooves.

FIG. 3 depicts a semiconductor wafer assembly comprising a semiconductor wafer and a plurality of unsegmented (undiced, unsingularized) semiconductor dice on a circuit side of the wafer. The circuit side further comprises a coating layer such as the two tetraethylorthosilicate layers and an overlying nitride layer as described above and/or a polyimide layer formed thereon. Ideally, the semiconductor wafer itself is planar across its front and back. Depending on the type of device to be produced, the wafer can be background (backlapped) such that it has a nominal thickness of between about six mils and about nine mils. A typical diameter of the semiconductor wafer is 200 millimeters, although wafers having larger and smaller diameters are well known.

During testing it has been found that forming a coating layer such as that described above can result in warping of the wafer. The warping may become more exaggerated with backgrinding of the wafer. The warping is believed to occur from surface tension exerted on the wafer by the coating. During the cure of a layer such as the polyimide coating, a percentage of the solvent is removed which causes a volumetric decrease in polyimide material. The polyimide adheres to the wafer assembly and a resulting surface tension is applied to the assembly by the coating as the polyimide outgasses the solvent. Testing on 200 millimeter production wafers having a thickness of 300 microns and a nine micrometer ($\mu$m) thick layer of polyimide demonstrated a mean warpage across two wafers of 578.29 $\mu$m as measured with a model 9500 UltraGage™ system available from ADE of Westwood, Mass.

Figure 4:
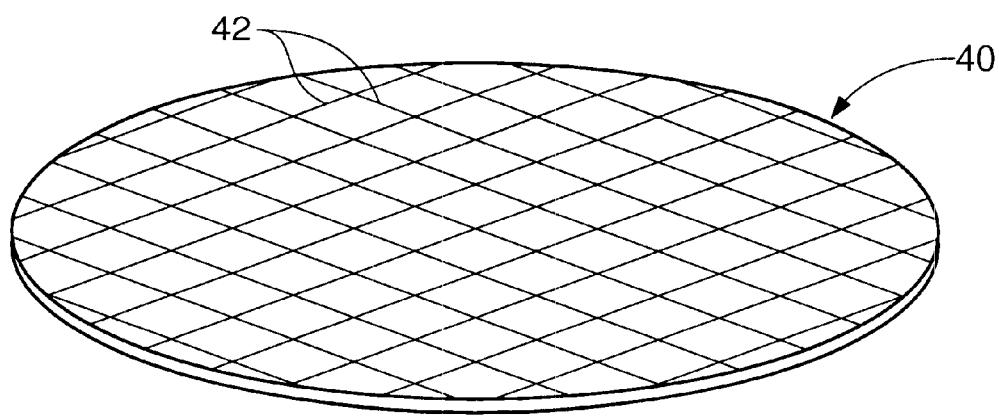
FIG. 4 is an isometric view depicting a wafer assembly having a coating layer with a first series of spaced grooves formed in perpendicular relation to a second series of spaced grooves.

To relieve the surface tension exerted by the coating on the circuit side of the wafer a series of grooves 32 is cut into the coating layer as depicted in FIG. 3, for example using a wafer saw. The grooves can also be etched into the coating layer, for example simultaneously with the masking and etching of the coating to expose the bond pads. Etching the layer during formation of the bond pads requires no additional masking, etching, or transporting. In FIG. 3 each groove extends between two points of an arcuate perimeter which defines a center region of the wafer assembly. In FIG. 4 a wafer assembly 40 is depicted having grooves 42 etched into the coating in two directions across the center portion of the wafer, for example intersecting at a 90° angle.

Figure 5:
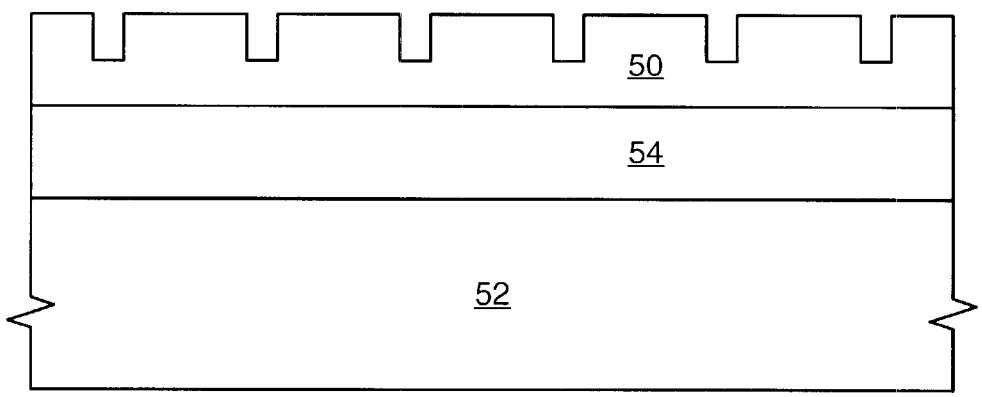
FIG. 5 is a partial cross section of the FIG. 3 wafer assembly having spaced grooves which do not extend entirely through the coating layer.
Figure 6:
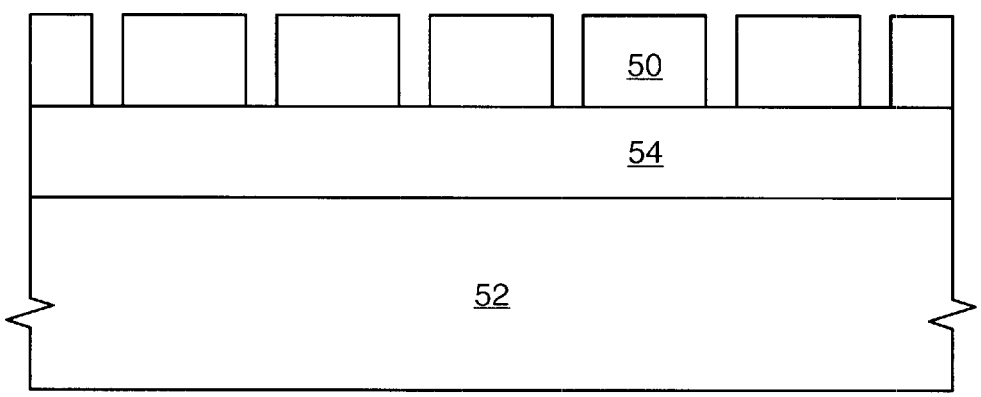
FIG. 6 is a partial cross section of the FIG. 3 wafer assembly having spaced grooves which extend entirely through the coating layer but not into an underlying layer.

The coating material 50 can be etched or cut partially through its thickness as depicted in FIG. 5 which does not expose an underlying layer 54, or, preferably, completely through its thickness to expose an underlying layer 54 as depicted in FIG. 6. For example, if a polyimide coating layer overlies a passivation layer, the polyimide can be etched to expose the passivation. Etching completely through the thickness of the coating is expected to provide the greatest surface tension relief. Further, the underlying layer can be etched if it is found to contribute to wafer warping or for other reasons.

Figure 7:
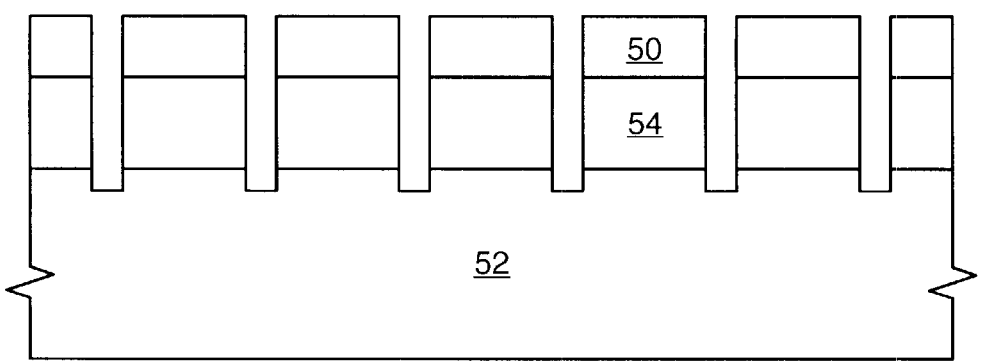
FIG. 7 is a partial cross section of the FIG. 3 wafer assembly having spaced grooves which extend entirely through the coating layer, an underlying layer, and partially into the semiconductor wafer.

In another embodiment the coating layer 52 and other layers 54 overlying the wafer surface 52 are etched thereby exposing the semiconductor wafer. It is also possible to etch slightly into, but not completely through, the semiconductor wafer 52 to ensure the coating layer 50 is completely etched through as depicted in FIG. 7. This is possible if the wafer is etched or cut in the area of a saw kerf which will subsequently singularize the individual semiconductor dice. Thus in this embodiment a first portion of the semiconductor wafer is removed in the area of the saw kerf in a first step, and the remaining portion of the semiconductor wafer is removed in the area of the saw kerf in a second step to singularize the dice. Thus the first step pre-etches or pre-cuts the wafer and the second step segments the wafer into singularized semiconductor dice. Various intervening steps, such as backgrinding the wafer and/or rerouting of metal lines over the polyimide, can be performed between the first step which removes the first portion of the semiconductor wafer and the second step which removes the second portion of the semiconductor wafer.

During testing it has been found that the warp of test wafers described could be significantly reduced by cutting groves into the overlying polyimide layer. A series of grooves each 0.25 mil deep and spaced 30 mils from adjacent grooves was cut into a nine $\mu$m (0.35 mil) thick layer of polyimide overlying a 200 millimeter production wafer. Mean warpage across two wafers subsequent to cutting the groves was 367.93 $\mu$m as measured with the model 9500 UltraGage™ system described above. This is a 64% improvement over the average of 578.29 $\mu$m of warp for the two uncut wafers as described above. With this reduction in wafer warpage, problems such as loss of vacuum between the flexible chuck and the wafer during transportation which can result in damage or breakage of the wafer will likely be reduced.

While this invention has been described with reference to illustrative embodiments, this description is not meant to be construed in a limiting sense. Various modifications of the illustrative embodiments, as well as additional embodiments of the invention, will be apparent to persons skilled in the art upon reference to this description. It is therefore contemplated that the appended claims will cover any such modifications or embodiments as fall within the true scope of the invention.

What is claimed is:

1. A method used during the formation of a semiconductor device comprising the following steps:
   providing a semiconductor wafer assembly comprising a semiconductor wafer having a plurality of unsingularized semiconductor dice on a circuit side thereof;
   forming a coating layer over said wafer assembly;
   forming a series of grooves in said coating layer, wherein subsequent to said step of forming said grooves in said coating layer, said plurality of dice remain unsingularized; and
   subsequent to forming said grooves in said coating layer, removing a portion of said semiconductor wafer from said circuit side of said wafer assembly, to singularize said plurality of dice.

2. The method of claim 1 further comprising the following steps:

during said step of forming said grooves in said coating layer, forming said grooves over a kerf area of said semiconductor wafer; and during said step of removing a portion of said semiconductor wafer from said circuit side of said wafer assembly, removing said kerf area of said semiconductor wafer to singularize said plurality of dice.

3. The method of claim 2, wherein said step of forming said grooves comprises etching said coating layer using a dry etch, and said step of removing said kerf area comprises sawing said kerf area to singularize said semiconductor dice.

4. The method of claim 3 wherein said semiconductor wafer assembly further comprises a plurality of bond pads on said circuit side of said wafer assembly, further comprising the step of etching said coating layer to expose said bond pads during said step of forming said grooves.

5. The method of claim 2, wherein said step of forming said grooves comprises sawing said coating layer using a wafer saw, and said step of removing said kerf area comprises sawing said kerf area to singularize said semiconductor dice.

6. The method of claim 5 further comprising the step of backlapping said semiconductor wafer subsequent to said step of forming said grooves and prior to said step of removing said kerf area.

7. A method used during the formation of a semiconductor device comprising the following steps:

providing a semiconductor wafer assembly comprising a semiconductor wafer and a plurality of unsingularized semiconductor dice, said semiconductor dice comprising a plurality of bond pads;

forming a coating layer over said plurality of semiconductor dice and over said bond pads;

removing said coating layer from over said plurality of bond pads;

forming a series of grooves within said coating layer;

backgrinding said semiconductor wafer; and subsequent to said step of backgrinding said semiconductor wafer, dicing said semiconductor wafer.

8. The method of claim 7 wherein said step of forming said coating layer forms a polyimide layer.

9. The method of claim 8 wherein said step of forming said grooves includes forming said grooves over a kerf area of said semiconductor wafer and said step of dicing said wafer includes removing said kerf area of said wafer.

10. The method of claim 8 further comprising performing said steps of removing said polyimide layer from over said plurality of bond pads and forming said grooves within said polyimide layer simultaneously.

11. The method of claim 7 further comprising the step of removing a portion of said semiconductor wafer during said step of forming said grooves in said coating layer, wherein said semiconductor dice remain unsingularized during said step of backgrinding said semiconductor wafer.

12. A method used during the manufacture of a semiconductor device comprising the following steps:

providing a semiconductor wafer assembly comprising a semiconductor wafer and a plurality of unsingularized semiconductor dice, wherein said wafer exhibits a first degree of warping;

forming a coating overlying said semiconductor wafer, wherein said wafer, subsequent to forming said coating, exhibits a second degree of warping greater than said first degree of warping; and forming a series of grooves in said coating layer wherein subsequent to forming said grooves said semiconductor dice remain unsingularized and said wafer exhibits a third degree of warping less than said second degree of warping.

13. The method of claim 12 wherein said step of providing said semiconductor wafer assembly comprises providing a semiconductor wafer having an arcuate perimeter and a center portion bounded by said arcuate perimeter, and wherein said step of forming said grooves in said coating layer comprises forming said grooves to extend between at least two points of said arcuate perimeter through said center portion of said wafer.

14. The method of claim 12 further comprising the following steps:

providing bond pads during said step of providing said semiconductor wafer assembly;

forming said coating overlying said bond pads during said step of forming said coating; and exposing said bond pads during said step of forming said grooves.

15. The method of claim 14 wherein said step of forming said grooves is performed using a dry etch.

16. The method of claim 12 wherein said step of forming said grooves forms said grooves over a saw kerf area of said semiconductor wafer.

17. The method of claim 16 further comprising the step of removing a portion of said semiconductor wafer during said step of forming said grooves in said coating.

18. The method of claim 12 further comprising the following steps:

backgrinding said semiconductor wafer subsequent to said step of forming said grooves; and singularizing said semiconductor dice subsequent to said step of backgrinding said semiconductor wafer.

* * * * *

UNITED STATES PATENT AND TRADEMARK OFFICE
CERTIFICATE OF CORRECTION

PATENT NO.      : 6,403,449 B2
DATED           : June 11, 2002
INVENTOR(S)     : Eugene P. Marsh It is certified that error appears in the above-identified patent and that said Letters Patent is hereby corrected as shown below:

Column 5,
Line 48, before "methyl" change "a" to -- α --

Column 6,
Line 2, change "an" to -- a --
Line 10, make the sentence starting "The techniques" a new paragraph.

Column 8,
Line 13, after "produce" and before "base" insert -- a --

Signed and Sealed this

Eighth Day of July, 2003

JAMES E. ROGAN
*Director of the United States Patent and Trademark Office*

UNITED STATES PATENT AND TRADEMARK OFFICE
CERTIFICATE OF CORRECTION

PATENT NO. : 6,403,449 B1
DATED : June 11, 2002
INVENTOR(S) : Michael B. Ball

It is certified that error appears in the above-identified patent and that said Letters Patent is hereby corrected as shown below:

This certificate supersedes Certificate of Correction issued July 8, 2003, the number was erroneously mentioned and should be vacated since no Certificate of Correction was granted.

Signed and Sealed this

Twenty-eighth Day of June, 2005

JON W. DUDAS
*Director of the United States Patent and Trademark Office*